US008611845B2

(12) United States Patent
Basawapatna (10) Patent No.: US 8,611,845 B2
(45) Date of Patent: Dec. 17, 2013

(54) ENHANCED FLEXIBILITY COUPLER FOR RF POWER DETECTION AND CONTROL

(76) Inventor: Anand Ganesh Basawapatna, Greenwood Village, CO (US)

( * ) Notice: Subject to any disclaimer, the term of this patent is extended or adjusted under 35 U.S.C. 154(b) by 154 days.

(21) Appl. No.: 13/371,409

(22) Filed: Feb. 11, 2012

(65) Prior Publication Data
US 2013/0207710 A1 Aug. 15, 2013

(51) Int. Cl.
*H04B 1/16* (2006.01)
(52) U.S. Cl.
USPC ........ 455/341; 455/107; 455/115.1; 455/117; 455/126; 333/109; 333/110; 333/111; 333/112
(58) Field of Classification Search
USPC ............. 455/91, 107, 115.1, 117, 126, 248.1, 455/280, 287, 341; 333/109–116
See application file for complete search history.

(56) References Cited

U.S. PATENT DOCUMENTS

| 4,758,793 A * | 7/1988 | Sheade et al. ................ 327/350 |
| 7,327,303 B1 * | 2/2008 | Halsey et al. ................... 342/20 |
| 2011/0298539 A1 * | 12/2011 | Drogi et al. .................... 330/129 |

* cited by examiner

*Primary Examiner* — Tuan Pham (57) ABSTRACT

This invention describes a method by which the output power of a circuit or system at any point can be efficiently and cost effectively sampled in a simple and broadband fashion for processing in a closed loop system for applications such as power level control in very broadband circuits. A divider circuit consisting of a selection of passive lumped elements is used to create a very broadband means of sampling the RF power level at any point in a transmission line. Unlike prior art schemes of this nature, this circuit does not rely upon extremely accurate element values and minimization of parasitic reactances. Used in conjunction with a balanced detector-logarithmic or other amplifier combination this invention result in a very broadband low cost simplified realization of the traditional costly bandwidth limited directional coupler-detector combination.

19 Claims, 7 Drawing Sheets

ENHANCED FLEXIBILITY COUPLER FOR RF POWER DETECTION AND CONTROL

CROSS RELATION TO RELATED APPLICATIONS

Not Applicable

FIELD OF THE INVENTION

This invention pertains to RF, Digital, and Analog Circuits. In particular it pertains to circuitry used to monitor and control signal levels in circuits and systems.

DEFINITION OF TERMS

Detector: A device that converts input RF signal to a baseband output that is proportional to the level of the input signal.

Directivity: The ability of a device to sample the forward wave on a transmission line and not the reflected wave. Directivity is defined as the forward coupling coefficient in dB minus the reverse isolation of the coupler in dB.

Parasitic: Circuit elements that are unintentionally inserted into a circuit because of the RF properties of devices. For example, an RF circuit resistor will not only have a resistance value, but an inductance value due to the self inductance of the element, and a capacitance value by virtue of the element's proximity to a ground plane.

Square Law Detector: A detector whose output d.c. voltage is directly proportional to the input RF power. It reflects the fact that the RF power is proportional to the square of the input voltage.

DUT: Device Under Test. A term used in test and measurement instrument literature to describe the item tested, and sometimes how the instrument is connected to what is being tested.

Characteristic impedance: It is the impedance with which, if a transmission line is terminated, none of the incoming energy will be reflected.

BACKGROUND OF THE INVENTION

In many RF and microwave systems used in defense, telecommunications, and instrumentation applications it is necessary that the power level of the signal at certain critical points in the system be monitored and carefully controlled. The signal level may affect the desired range of propagation of the signal in free space, or it might affect the nonlinear performance of elements that follow it, such as power amplifiers. Such systems are called leveling detector systems since the RF power or a part of is detected and converted to a proportional dc value and used in some kind of a feedback scheme, often called a Leveling Loop, to achieve the level desired.

To control the signal level in an RF system three basic requirements are often imposed. First, a small or negligible portion of the signal needs to be sampled. Second, the sampled signal is often desired to be sampled as closely as possible from the forward wave. This is called the directionality of sampling scheme. And third, in order to have good broadband performance, the proportionality of the detected dc voltage to the RF signal power level as a function of the RF frequency should be constant.

Any practical leveling detector system is typically a compromise between these three requirements. Most directional couplers are bandwidth limited so it is difficult achieve good multi-octave bandwidth directivity. Also, the detector element usually has a frequency dependent transfer function, due to chip, parasitic element, and balance issues. For these reasons directional detectors spanning multiple octaves or one or more decade of bandwidth are expensive.

The present invention achieves a practical compromise so that practical leveling accuracy and wide bandwidth performance are realized in such a way that the costs are minimized and performance maximized by a combination of hardware and software means.

SUMMARY OF THE INVENTION

As telecommunications and instrumentation and defense systems operate over wider and wider bandwidths, it has become necessary for very wide frequency ranges of signals to be generated. Thus present telecom systems or defense systems may need to cover a frequency range of a 150 MHz to well over 6000 MHz, sometimes up to 20,000 MHz or beyond. To accurately measure and control the signal levels at any point in a circuit or system over such wide ranges, one needs to monitor the signal level at that point in the circuit as unobtrusively as possible. Traditionally this has been done via signal probes or some coupling mechanism or circuit where a small portion perhaps 10 or 20 dB below the signal level is sampled and accurately measured, usually via a square law detector and a logarithmic amplifier. The former converts the RF signal level to a DC voltage in a square law fashion so that the detected DC voltage output is directly proportional to the RF signal level in the circuit at that point, and the latter converts the power level measurements into something that can be linearly manipulated and controlled in decibels, or dB.

As can be appreciated by anyone familiar with the art, most circuit elements used in such broadband circuits do not act like pure resistors, inductors or capacitors, or indeed like transmission lines. Every circuit element has associated with it parasitic element values that cannot be ignored and that often limit the useful bandwidth of a design. As a result there are significant deviations in the measured signal voltage levels versus the theoretically estimated.

It is a prevalent misconception among system designers that the directivity of a leveling system is fundamental to leveling accuracy. Except for high accuracy Network Analyzer type measurements, where the device or sub-system under test (DUT) could possibly have significant impedance mismatch to the input transmission line and where the DUT could be a considerable distance from the signal source that is part of the measurement setup, and the signal source impedance is fundamental to the measurement accuracy, this should almost never be a concern. This point is widely not well understood. As a result very complex directional detector schemes are used at great cost to solve, what in a majority of instances, is a non-existent problem. This is explained in greater detail in the discussion of FIGS. 1 and 2 in a later section.

Our invention is aimed at solving the two biggest issues associated with prior resistive directional detectors: The first is fact that their directional coupling and directional detection functions, as a matter of realizable practicality are inseparable, and second, that the effects of circuit parasitics not only limit the usable bandwidth, but make a true realization inordinately expensive. In addition, the fact that in most practical circuits the circuit elements are in close proximity to each other and the concept of an interconnect being a transmission line of any length is not meaningful, leveling schemes have no relation to forward and backward waves, but rather to the voltage and current at any point in the circuit. Thus directivity in these instances is a moot concept.

Prior resistive directional couplers have been based upon a resistive bridge concept. This is described in greater mathematical detail in the "detailed description of the drawings" section. The directivity in resistive couplers is based upon the observation that, as shown in the discussion of the drawings, in the reverse path, in the ideal case, there is a perfectly balanced bridge, i.e. there is no voltage across the detector diode developed by any reflections. In actuality, this needs the assumption that the impedance of the capacitor $Z_c$ is negligible, and the impedance of the detector circuit, $Z_{det}$ is infinite. In no practical case is this true. All the elements in the circuit couple to some extent to each other, and when their impedances have widely divergent values, as is needed in such designs, the directivity is compromised.

Thus the resistive bridge directional detector depends on some almost physically unrealizable assumptions that it takes a significant amount of cost in terms of circuitry to approximate, making it a very costly and of highly limited usefulness except in very specific measurement cases, type of circuit. Further, as pointed out before, the concepts of a forward wave, a reflected wave, and a characteristic impedance are not meaningful in many of today's highly integrated designs.

The present invention eliminates all these assumptions, while keeping the idea of voltage ratios intact. Firstly, we use five known and finite resistors—neither zero nor infinite impedance to form the sampling detector circuit. Secondly, we assure that the only need is for a balanced input to an amplifier across the cross member of the bridge—i.e. we do not need a diode with an infinite impedance assumption. Third, we then correct for all frequency dependencies that arise out of these assumptions in software. We keep the voltage at a defined point fixed. We claim this creates a sufficiently accurate signal level reference for most applications. At the same time it eliminates much of the expensive bandwidth limiting technology associated with the traditional resistive directional bridge.

This invention is based upon the typically unrecognized fact that, between the components of a system, for example between two functional blocks within the same integrated circuit, the line lengths are so small that the concept of a source impedance and a load impedance have very little to do with the characteristic impedance of the transmission line connecting them—the transmission line, if it exists between the elements at all, in fact, is nothing more than an element in an impedance matching network between the two. This immediately implies that a circuit with infinite dissymmetry, such as a directional detector, is not as good in such a system as a perfectly symmetrical level sensing system.

It is further clear from this very symmetry of the circuit that all the element parasitics being exactly equal, tend to totally balance out, and as a result, have little effect on the output of the balanced detector. Further, the realization shows clearly that the element values do not need to be disparate to obtain reasonable coupling coefficients as in the case of the so-called directional detectors. This makes them easier to design, realize and compensate for over broad frequency ranges. Clearly the costs are therefore much less, and in most cases with negligible difference in performance, if any. This is demonstrated in the detailed descriptions.

BRIEF DESCRIPTION OF THE DRAWINGS

The exemplary embodiments are best described by referring to the drawings attached. It should be emphasized that these drawings are for the purpose of explanation only, and do not necessarily reflect actual values of components or shapes. It should be appreciated that the sizes of components as well as their parasitic element values will vary widely depending on the technology used, for example surface mount or monolithic microwave integrated circuit.

DETAILED DESCRIPTION OF THE PREFERRED EMBODIMENTS

The invention concepts are attempted to be described using the drawings referred to. They do not represent all possible embodiments, but are used for illustrative purposes only.

Figure 1:
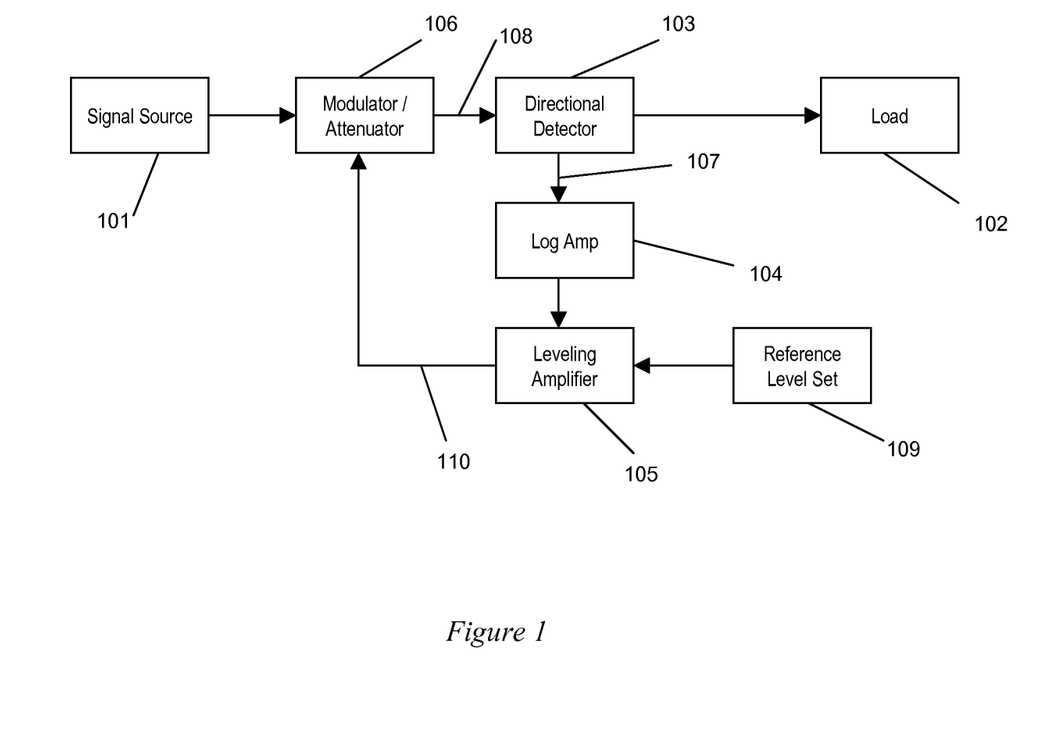
FIG. 1 shows a typical level control scenario in block diagram form.

FIG. 1 shows a typical level-control scheme used often in many microwave signal sources or at points where a programmable leveled output is needed. The signal to be measured is output by a source, 101. This could be an element of a system that is part of a larger chain of elements such as an amplifier, modulator or an oscillator. The source can have many output ports, but the port that is of concern, in this discussion is connected to a modulator or attenuator 106, typically via a coaxial cable, or a microstrip or stripline transmission line which could be part of an Integrated Circuit layout. The modulator, 106, is in turn connected to a directional detector, 103, for the purposes of measuring the signal level, and the through (or forward) signal output of the directional detector is connected to the load, 102. The load, in this case may actually be nothing more than the subsequent element in the signal chain. For example it can be another amplifier, an antenna, a pulse modulator, or a power divider. It can be in close physical proximity to the directional detector or quite far away. It can be a DUT in a network measurement system. The detected output of the directional detector, 107, is input to a logarithmic amplifier, 104. The output voltage of the logarithmic amplifier is ideally proportional, in dB, to the power level of the signal at the source output, 108. This output is fed into one port of a leveling amplifier, 105. A reference level, 109, which is a voltage proportional in dB to the desired power level at 108, is fed into the other input of the leveling amplifier 105. The output of the leveling amplifier 110 is fed back into the modulator or attenuator 106. If the signal level at 108 is higher than desired, the attenuation of the attenuator 106 is increased, and if the signal level is lower, the attenuation is decreased, thus keeping the signal level at the input to the load constant. The modulator/attenuator 106 can be either digitally controlled via a DAC or analog controlled using PIN diodes.

This leveling scheme has a number of areas of possible inaccuracy. It depends upon the ability of the directional detector to be accurate over wide frequency ranges such as 100 MHz to 18,000 MHz, and over a wide dynamic range of powers, such as −30 dBm to +20 dBm, for example. As will be described in the subsequent paragraphs, the directional detector itself can create a significant level of uncertainty or inaccuracy.

Figure 2:
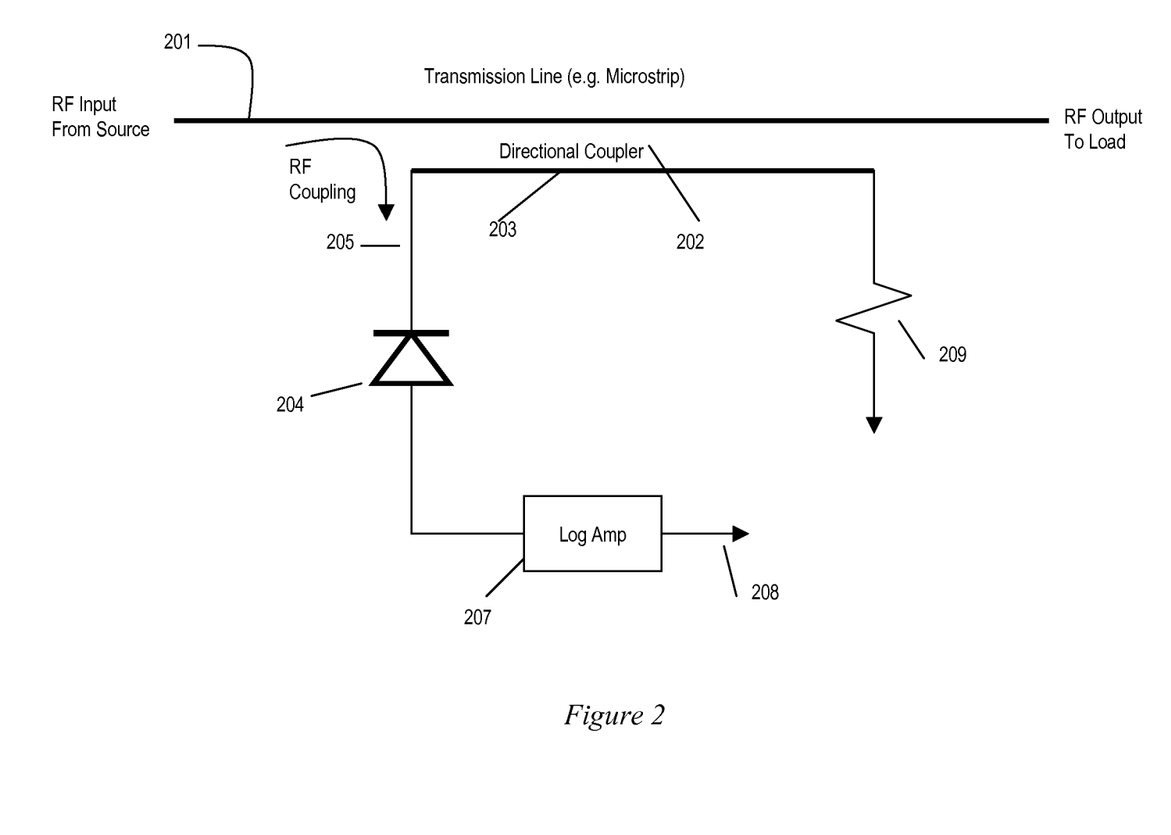
FIG. 2 shows a typical preferred embodiment in prior art, where a microstrip or coaxial wave-guide directional coupler is used in conjunction with a detector diode for signal level detection.

FIG. 2 demonstrates one of the traditional methods used to control signal level in RF and microwave circuits. The input signal 201 is fed to the input of a directional coupler 202, the output of which is connected to the load. The directional coupler has a coupling arm, 203, which, by virtue of its length, which is typically a quarter wavelength long at the center of the operating frequency range, and by virtue of its proximity to the main line, couples a portion of the forward wave energy into the coupled arm output 205. The matching terminating resistor 209 is intended to absorb all of the reflected signal coupled into the coupler in order to provide the desired directivity. The directional property of the coupler is a function of the physical length of the two transmission lines, the dielectric constant of the media surrounding these lines, and the packaging of the coupler, including the ground plane proximity. All these elements have to be taken into account in the design. As can be appreciated, all this adds inaccuracy in the amount of coupled energy as a function of frequency. The coupled output 205 is then connected to a detector, usually a diode, which, when operated in its square law region, outputs a dc voltage that is proportional to the input power. The diode has a limited square law region, and its own parasitics, all of which add to the inaccuracy of the leveling scheme.

Figure 3:
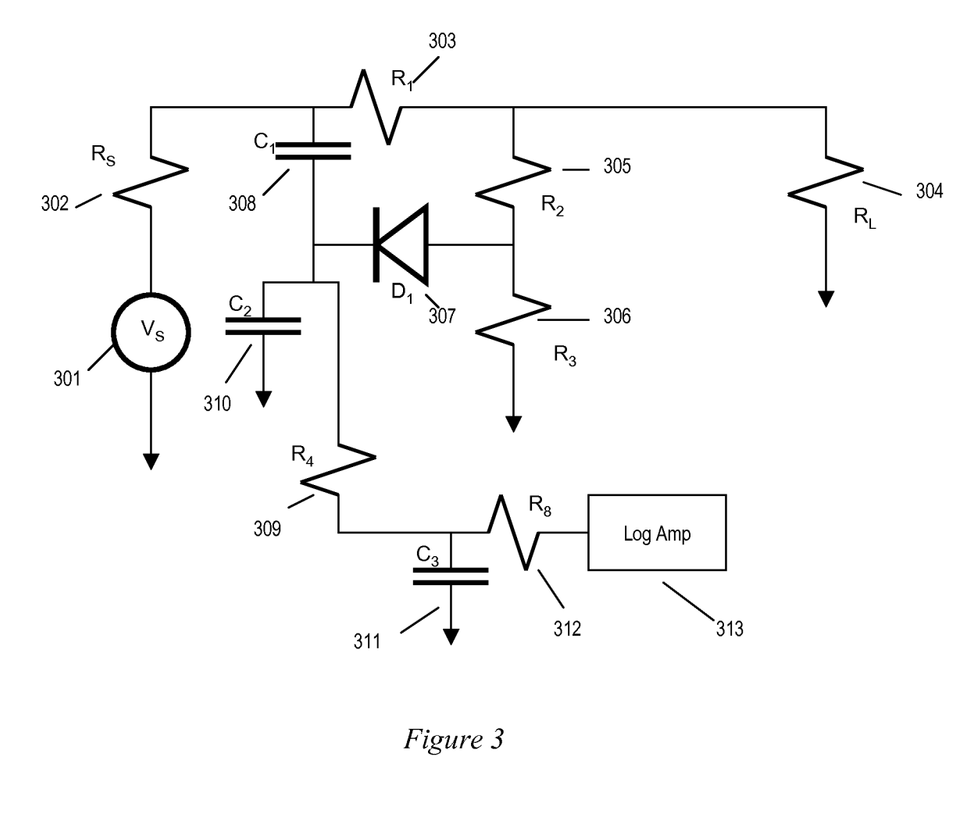
FIG. 3 shows a prior art lumped element realization of a directional detector. This is discussed in detail, since it forms the basis of most present lumped element IC designs, and its shortcomings are the basis for the present patent.

FIG. 3 demonstrates a traditional discrete element method of solving some of these problems. The source, 301, has a source voltage of Vs, and a source resistance, 302 of Rs. Elements R1, 303, R2, 305. R3, 306 along with Rs, form what is often called a directionsl Bridge, which connects to the load, R1, 304. In addition, the detection elements of the circuit are the diode, D1, 307, the isolation capacitors C1, 308, C2, 310 and output resistor R4, whose output is fed to a logarithmic amplifier.

The critical ratio of the system is the directivity of the bridge, which is imposed by the simple equation $$(R1/Rs)=(R2/R3)$$

In a typical 50 ohm characteristic impedance system as used in a network analyzer, for example, Rs and R1 are 50 ohms. In order to couple a small amount of energy, 20 dB in this example, and to provide a directive bridge, R1 is typically, close to 5 ohms, R2 is 50 ohms, and R3 is 500 ohms. The capacitor, C1 is made sufficiently large so that it theoretically has zero impedance. The bridge formed by R1 and Rs on the one side and R2 and R3 on the other, both have 10:1 impedance ratios (5/50 and 50/500), so that there is zero voltage across the diode when looking from the load R1.

The way the circuit is supposed to work is as follows. The voltage across the points A and B is directly proportional to the voltage Vs, and the values of Rs, R1, R2, R3, and R1. It is easily calculated using Ohms Law and elementary algebra. The diode detects this RF or microwave signal, converts it into a DC voltage Vd, which is fed to the logarithmic amplifier. A significant error in the system occurs here. The parasitic values of the elements Rs, R1, R2, and R3, plus the impedance of the load R1 as reflected at the point C all affect this detected voltage. For example, if R1 is created by a very large impedance separated a quarter wavelength of transmission line from point C, the effective value of R1 seen by the detector is a short circuit, the voltage Vb is practically zero, and the diode sees the full source voltage Vs. R1/(R1+Rs). This results in increased attenuation rather than decreased attenuation of the signal.

The voltage across the points A and C have to be detected by the diode D2, 307 in order to create the closed loop control. This involves isolating the diode from the point A via capacitor C1, and making sure that the RF voltages are bypassed by means of the resistor capacitor combination of R8 and C2. This part of the circuit has to be transparent to the RF signals, and to the extent it is not, will affect the fidelity of the transfer function. A diode is the only effective solution. Every one of these conditions is inherently unrealizable.

The claim that is made is that, to the extent the directivity is infinite, the source impedance stays constant. This is because, to the extent that (R1/Rs)=(R2/R3), the voltage at Vc has no effect on the RF voltage Va-Vb. However, as has been seen in the preceding paragraph, in any value close to the limit, the system asks for less power from the source when it should be asking for more. In areas close to the limit, the directionality of the directional detector, is therefore more than a little suspect.

It should also be pointed out here that not only is the value of R1 limited to a finite range for the solution to be viable, but so is the value of Rs. If the source, for example is a modulator that is almost turned off, then Rs can be either 0 or infinity, in which case the entire bridge falls apart.

Most importantly, for most circuits that matter, consider the situation in a well packed Microwave Monolithic Integrated Circuit. The distance between the source and the load has minimal lengths of transmission lines—it has impedance matching circuits. The concept of a characteristic impedance in such a situation is meaningless. Thus the realization of a bridge where the source and load impedances are not the ideal 50 ohms but a complex, frequency dependent impedance makes the directional bridge moot.

The fundamental problem with the directional bridge, as is obvious from the foregoing, is that it is essentially non-symmetric. The present invention recognizes this fact and this contradiction and proposes a more elegant and better-controlled and more meaningful solution. The solution is described in FIG. 4.

Figure 4:
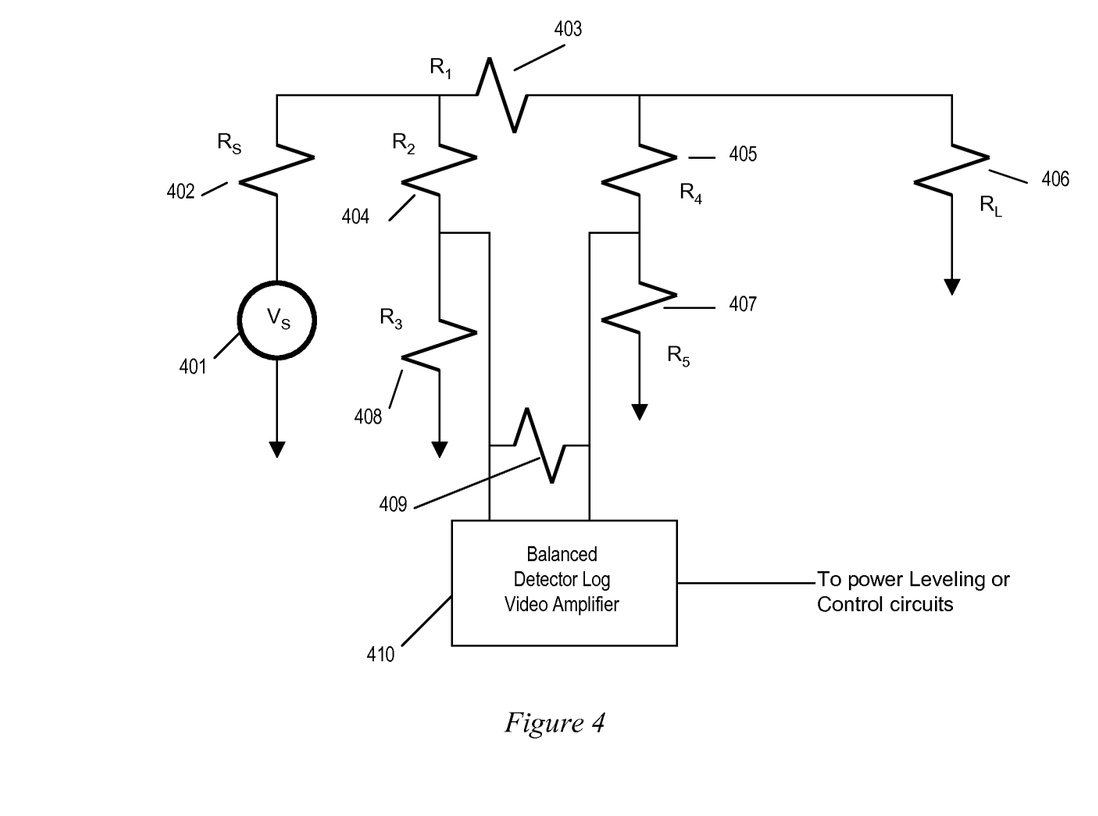
FIG. 4 shows one preferred embodiment that corrects many of the shortcomings of the prior embodiments in actual usage situations.

Referring to FIG. 4, the source voltage Vs, 401, with its source impedance, Zs, 402, feeds a circuit consisting of 5 resistors, R1, 403, R2, 404, R3, 408, R4, 405, and R5, 407. This is connected as shown to the load, R1. The big difference between this circuit and the one in FIG. 3, is that it has a symmetrical topology. R1 is made typically very small compared to the source and load impedances, and R2, R3, R4, and R5 are made very large, for example 500 ohm each in a 50 ohm system. This accomplishes two things. It minimizes the power lost to the sampling mechanism, and it makes it possible to achieve a balanced broadband output. It minimizes the coupling at the cost of directivity, which we have seen has almost no meaning in most non-broadband high dynamic range network analyzer type applications.

The differential voltage, Vdiff, 410, developed across points B and D can be shown to be related to the voltage Vc, by the equation $$Vdiff = \frac{Vc \cdot R1 \cdot (R1 + R7)}{2 \cdot (R1R1 + R1R7 + R1R7)}$$

This differential voltage is connected to the inputs of a commercially available Detector Log Video Amplifier (DLVA) such as the Analog Devices AD 8317, shown as item 408, with a balancing resistor, 409.

The amount of power lost in the coupler can be made small both by decreasing R1 and increasing R2, R3, R4, and R5. For example, if R1=5 ohms, Rs=R1=50 Ohms, and R2=R3=R4=R5=500 ohms, the difference voltage is approximately Vin/20.

An important thing to observe about the equation is that, if R1 is ¹⁄₁₀ th the value of Rs and R1, and if R7=R6 is 20 times R1, the equation reduces to $$Vdiff=Vc/20$$

Further, the impedance looking back from the DLVA 408 is totally independent of any of the active RF circuits, R6 and R7 dominate it all. A 50 ohm balancing resistor across the input makes no difference to the impedance equation. Parasitics are no longer a problem and directivity is a non issue. It gives our invention some great advantages.

First, since the shunt elements are large, it is possible to select elements with low series parasitics (which are geometry dependent) so parasitics do not play a big part.

Second, since they are equal in all 4 elements, and the output voltage is almost strictly a function of the ratio of these values, the parasitic effects get common-moded out.

Third, since the impedance looking back from the DLVA towards the coupler is so high, the balance can be perfect unlike the previous case where the source impedance of the diode makes the detector output circuit very critical and frequency dependent and bypassing is a critical issue Fourth, the value of R1 in relation to Rs and R1 effectively determines the coupling. Since this is not a bridge, the values of R2, R3, R4, and R5 can be completely separated out from this critical factor. This is a great physical realizability advantage over the directional detector.

Fifth, by enabling the driving of a commercial DLVA, it makes the detector able to use newer commercial devices without any circuit redesign. And, in addition, it allows the separation of the coupling and detection functions, allowing improvements in the detector to be easily incorporated in future designs.

Our invention is thus able to create a solution that was hitherto non-obvious. It takes into account the necessity to minimize the effects of parasitics, put a boundary on the value of directivity in highly integrated circuits, and creates a solution that does not depend upon a single diode element that cannot work over a wide dynamic range.

Figure 5:
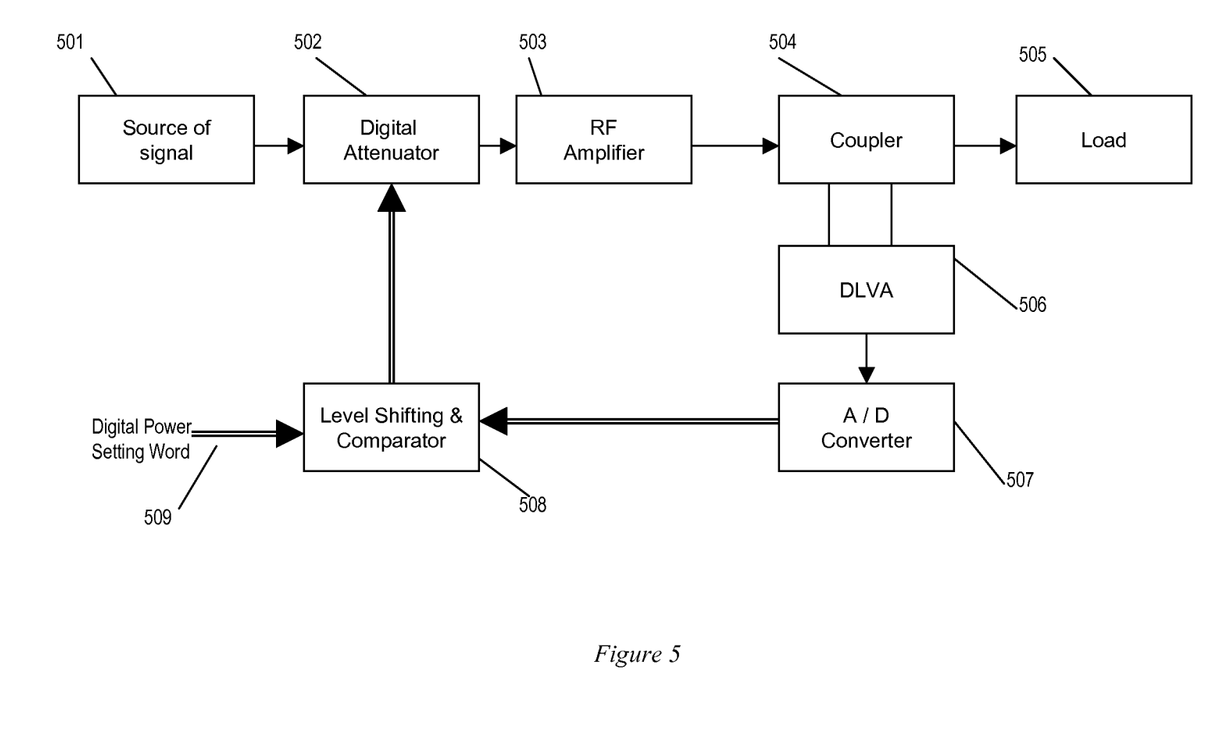
FIG. 5 shows block diagram leveling loop realization based upon the invention.

FIG. 5 shows an example of the use of the invention in a digital leveling loop. The signal source 501 output is passed through a digital attenuator, 502, and in this instance an RF amplifier 503 as an example to the detector 504 and thence to the load 505. The balanced output of the detector is connected to DLVA 506 and the DLVA output is connected to the Analog to Digital converter 507. The ADC output and a Digital word representing the desired power level are fed to a digital comparator 508 and the error word is used to digitally control the attenuator 502. The closed loop adjusts the attenuator until the error is zero. These elements are typically in close proximity to each other—however, if they were not the performance of the leveling loop will still maintain the power available at the load port of the coupler.

Figure 6:
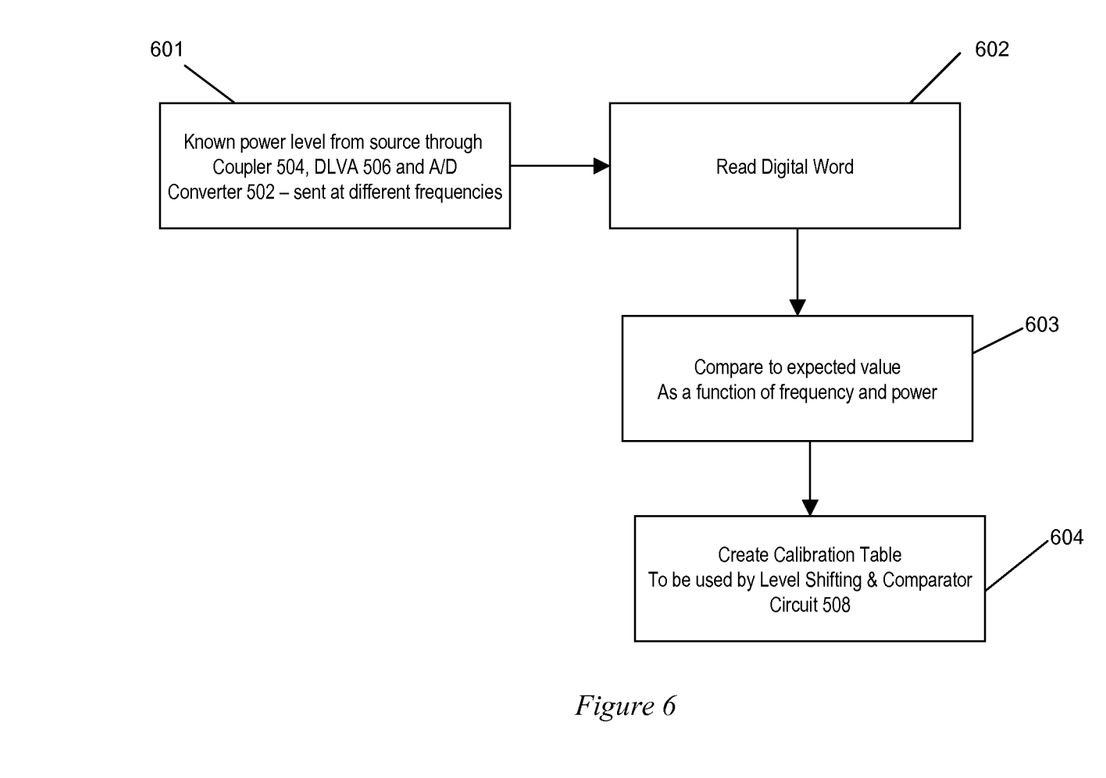
FIG. 6 shows a flow chart of the error correction software that allows broad bandwidth operation.

FIG. 6 is an example of how the comparator can be programmed to correct for frequency characteristics and parasitics of the elements as well as any nonlinearity in the transfer function of the DLVA over its dynamic range. A known source 601 is substituted for source 501 and measurements of the DLVA output versus frequency and power level are made at the output of the ADC, 507. This digital word is read via a circuit 602, which could for example be a microcontroller to read and output the word upon a trigger command. These are compared to the theoretically calculated levels via a comparator, 604, which could simply be a subtraction command in the microcontroller. The difference word is then used to create a correction table 604 which is resident in the EEPROM that is used to perform the Level shifting and Comparator function, 508, to control the signal level to the programmed value.

Figure 7:
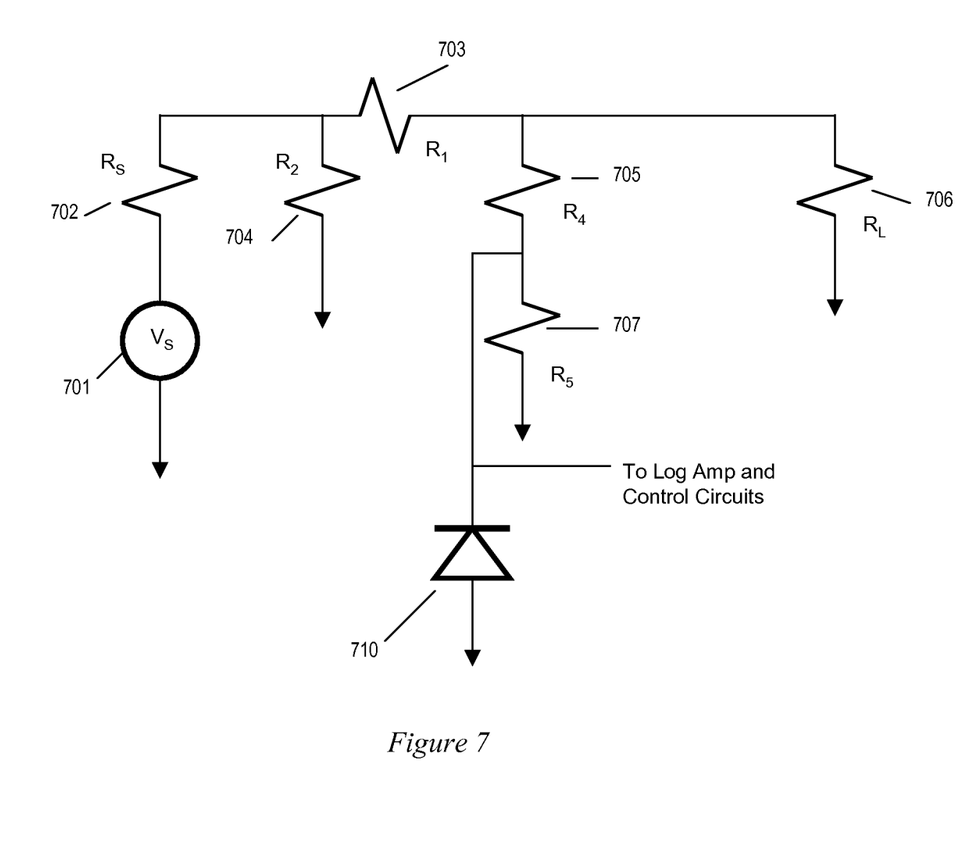
FIG. 7 shows a single ended configuration that has most if not all the advantages of the invention in relation to parasitic minimization.

It should be pointed out that the choice of the resistors in the sampler circuits is in no way constrained to be symmetrical. In fact the circuit allows itself to be designed based upon the detection scheme being used. For example, in FIG. 7, a single ended diode detector configuration is shown which has all the advantages of the present invention with none of the disadvantages of the directional detector. In this case, the source 701 and source impedance 702 are connected to the load resistor 706 through the sampling resistor combination 703, 704, and 705, and 707, where resistance R2, 704 could be equal to R4, 705 plus R5, 707. Then the voltage at the detector diode, 710, is single ended and referred to ground, and does not have the parasitic difficulties associated with the directional detector. The diode in this circuit could just as easily be replaced with a single ended DLVA also.

It should also be pointed out that, in this respect, the present invention represents a superset of many of the prior art circuits. For example, by choosing the values or resistors R3, R3, R4, and R5, one could realize the directional bridge circuit, albeit with all its problems.

We claim:

1. A power sampler circuit that allows true detection of power levels in a circuit with an arbitrarily settable coupling factor comprising:
    a combination of a very small value series resistor and four large value parallel resistors arranged two in series with each other are placed between a source and a load, samples the voltage across the small series resistor so that the resultant voltage can be connected to a balanced detector log video amplifier with minimal parasitic effects arising out of the resistive elements,
    wherein the small series resistor is a small fraction of the source and lad impedance values at the frequencies of operation,
    wherein the large parallel resistors are many times larger than the source and load impedances at the frequencies of operation,
    wherein the large parallel resistors can be chosen to be equal to each other in order to provide symmetry and perfect balance and parasitic effect minimization, or varied to provide the ability to feed arbitrary detection devices with arbitrary impedances or provide acceptable levels of directionality if needed by a particular system,
    wherein the output of the power sampler circuit is connected to a balanced Detector Log Video Amplifier to provide a detected output that is directly proportional in dB to the circuit power level at the sampling point.

2. The power sampler circuit of claim 1, wherein the Detector Log Video Amplifier can be replaced with any combination of elements that provide a detected output that a user desires.

3. The power sampler circuit of claim 1, wherein the Detector Log Video Amplifier output is used to control the desired power level in an analog fashion.

4. The power sampler circuit of claim 1, wherein the Detector Log Video Amplifier output is used to control the signal level in a digital fashion.

5. The power sampler circuit of claim 1, wherein the resistors can be derived by IC layout means.

6. The power sampler circuit of claim 5, wherein the output of the sampler is connected to a balanced Detector Log Video Amplifier to provide a detected output that is directly proportional in dB to the circuit power level at the sampling point.

7. The power sampler circuit of claim 5, wherein the Detector Log Video Amplifier can be replaced with any combination of elements that provide a detected output that a user desires.

8. The power sampler circuit of claim 5, wherein the Detector Log Video Amplifier output is used to control the desired power level in an analog fashion.

9. The power sampler circuit of claim 5, wherein the Detector Log Video Amplifier output is used to control the signal level in a digital fashion.

10. The power sampler circuit of claim 1, wherein the resistors can be standard surface mount resistors or discrete resistors.

11. The power sampler circuit of claim 1, wherein the output of the sampler is connected to a balanced Detector Log Video Amplifier to provide a detected output that is directly proportional in dB to the circuit power level at the sampling point.

12. The power sampler circuit of claim 10, wherein the Detector Log Video Amplifier can be replaced with any combination of elements that provide a detected output that a user desires.

13. The power sampler circuit of claim 10, wherein the Detector Log Video Amplifier output is used to control the desired power level in an analog fashion.

14. The power sampler circuit of claim 10, wherein the Detector Log Video Amplifier output is used to control the signal level in a digital fashion.

15. The power sampler circuit of claim 1, wherein the resistors can be thin film resistors deposited on a Hybrid or Monolithic Microwave Integrated Circuit.

16. The power sampler circuit of claim 15, wherein the output of the sampler is connected to a balanced Detector Log Video Amplifier to provide a detected output that is directly proportional in dB to the circuit power level at the sampling point.

17. The power sampler circuit of claim 15, wherein the Detector Log Video Amplifier can be replaced with any combination of elements that provide a detected output that a user desires.

18. The power sampler circuit of claim 15, where wherein the Detector Log Video Amplifier output is used to control the desired power level in an analog fashion.

19. The power sampler circuit of claim 15, where wherein the Detector Log Video Amplifier output is used to control the signal level in a digital fashion.

* * * * *